(12) United States Patent
Lian et al.

(10) Patent No.: US 12,216,139 B2
(45) Date of Patent: Feb. 4, 2025

(54) ADAPTIVE FLEXIBLE CHIP TEST SOCKET AND FORMATION METHOD THEREOF

(71) Applicant: SEMIGHT INSTRUMENTS CO., LTD, Suzhou (CN)

(72) Inventors: Zhe Lian, Suzhou (CN); Jianjun Huang, Suzhou (CN); Yonghong Wu, Suzhou (CN); Shan Zhao, Suzhou (CN); Haiyang Hu, Suzhou (CN)

(73) Assignee: SEMIGHT INSTRUMENTS CO., LTD, Suzhou (CN)

( * ) Notice: Subject to any disclaimer, the term of this patent is extended or adjusted under 35 U.S.C. 154(b) by 0 days.

(21) Appl. No.: 18/432,932

(22) Filed: Feb. 5, 2024

(65) Prior Publication Data
US 2024/0410917 A1   Dec. 12, 2024

Related U.S. Application Data

(63) Continuation of application No. PCT/CN2023/134144, filed on Nov. 24, 2023.

(30) Foreign Application Priority Data

Jun. 6, 2023 (CN) .......................... 202310661566.8

(51) Int. Cl.
  *G01R 1/04* (2006.01)
  *G01R 1/02* (2006.01)
  (Continued)

(52) U.S. Cl.
  CPC ............. *G01R 1/0441* (2013.01); *G01R 3/00* (2013.01); *G01R 31/2886* (2013.01)

(58) Field of Classification Search
  CPC .......... G01R 1/02; G01R 1/04; G01R 1/0441; G01R 1/067; G01R 1/073; G01R 3/00;
  (Continued)

(56) References Cited

U.S. PATENT DOCUMENTS 5,647,756 A * 7/1997 Twigg ................. G01R 1/0433
                                                                  439/73
6,259,263 B1   7/2001 Lawrence et al.

FOREIGN PATENT DOCUMENTS

CN     102476487 A    5/2012
CN     206531926 U    9/2017
               (Continued)

*Primary Examiner* — Neel D Shah
(74) *Attorney, Agent, or Firm* — ANOVA LAW GROUP, PLLC

(57) ABSTRACT

The present disclosure includes an adaptive die test socket and a formation method. The die test socket includes an upper test socket and a lower test socket disposed directly below the upper test socket. The upper test socket is connected to a support frame; a strip-shaped through hole is formed on an upper surface of the support frame; a first protruding strip is at each of lower portions of two opposite inner walls of the strip-shaped through hole; a corresponding second protruding strip is at each of upper portions of two opposite side surfaces of the installation plate; and a side of a strip-shaped block is fixedly connected to the upper surface of the support frame, and another side of the strip-shaped block extends to directly above the second protruding strip and is connected to the second protruding strip through at least two springs.

10 Claims, 8 Drawing Sheets

(51) Int. Cl.
*G01R 1/067* (2006.01)
*G01R 1/073* (2006.01)
*G01R 3/00* (2006.01)
*G01R 31/26* (2020.01)
*G01R 31/28* (2006.01)

(58) Field of Classification Search
CPC ........ G01R 31/02; G01R 31/26; G01R 31/28; G01R 31/2886; G01R 31/69
See application file for complete search history.

(56) References Cited

FOREIGN PATENT DOCUMENTS

| | | |
|---|---|---|
| CN | 207926808 U | 9/2018 |
| CN | 114216593 A | 3/2022 |
| CN | 216083006 U | 3/2022 |
| CN | 217303869 U | 8/2022 |
| CN | 217403393 U | 9/2022 |
| CN | 218298448 U | 1/2023 |
| CN | 220207672 U | 12/2023 |
| CN | 220207673 U | 12/2023 |
| CN | 220381169 U | 1/2024 |

* cited by examiner

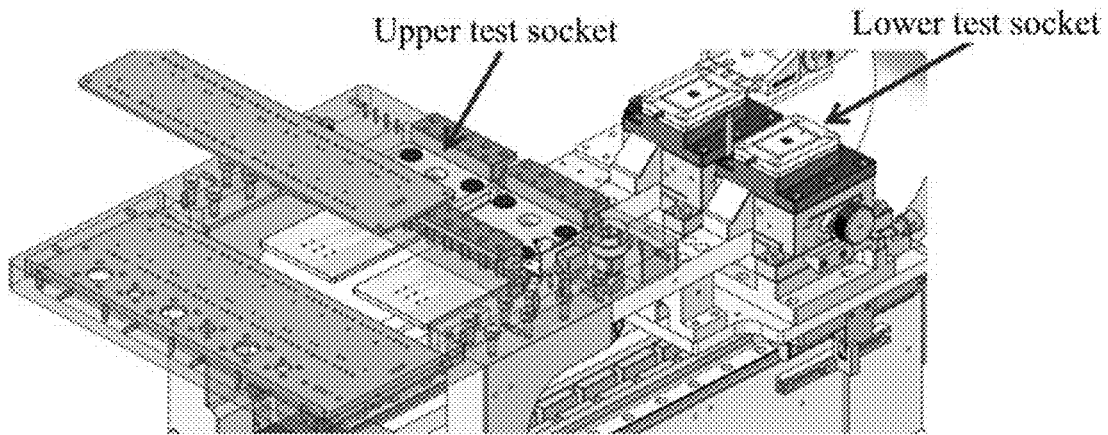

FIG. 13

| Providing an upper test socket and a lower test socket directly below the upper test socket, where the upper test socket and the lower test socket are capable of moving relative to each other along a vertical direction | S100 |

| Forming a groove at a lower surface of the upper test socket and/or at an upper surface of the lower test socket, such that an accommodating chamber for placing a chip to-be-tested is formed between the upper test socket and the lower test socket at a mold-closed state | S102 |

FIG. 14

ADAPTIVE FLEXIBLE CHIP TEST SOCKET AND FORMATION METHOD THEREOF

CROSS-REFERENCE TO RELATED APPLICATION

This application is a continuation application of PCT/CN2023/134144, filed on Nov. 24, 2023, which claims the priority of Chinese Patent Application No. 202310661566.8, filed on Jun. 6, 2023, the entirety of all of which is incorporated herein by reference.

TECHNICAL FIELD

The present disclosure generally relates to the field of semiconductor die testing technology and, more particularly, relates to an adaptive die test socket and a formation method thereof.

BACKGROUND

In the die testing industry, a die test socket is an indispensable tool for testing dies and is mainly used to install the dies and make physical connection of electrical signals between the dies and a testing apparatus. The die test socket includes a base and a spring pin disposed on the base. Through the contact between the spring pin and the die, the electrical connection to an electronic device with the die may be achieved, and relevant test screening may be completed.

In the existing technology, uneven attachment or contact may easily occur in the die test socket after mold closing is performed on upper and lower test sockets, which results in uneven contact resistance between test pins and a die test region, thereby affecting test data consistency and the lifetime of the test pins.

SUMMARY

One aspect of the present disclosure provides an adaptive die test socket. The die test socket includes an upper test socket and a lower test socket disposed directly below the upper test socket, where the upper test socket and the lower test socket are capable of moving relative to each other along a vertical direction; and a groove is formed at a lower surface of the upper test socket and/or at an upper surface of the lower test socket, such that an accommodating chamber for placing a die to-be-tested is formed between the upper test socket and the lower test socket at a mold-closed state. The upper test socket is connected to a support frame through an installation plate disposed above the upper test socket, where the support frame is capable of moving along a vertical direction; a strip-shaped through hole is formed on an upper surface of the support frame; a first protruding strip is at each of lower portions of two opposite inner walls of the strip-shaped through hole; a corresponding second protruding strip extending directly above the first protruding strip is at each of upper portions of two opposite side surfaces of the installation plate; a strip-shaped block is disposed above each second protruding strip; and a side of the strip-shaped block is fixedly connected to the upper surface of the support frame, and another side of the strip-shaped block extends to directly above the second protruding strip and is connected to the second protruding strip through at least two springs. When the upper test socket and the lower test socket are at a mold-opening state, a lower surface of the second protruding is adjoined to be in a contact with an upper surface of a corresponding first protruding strip; and when the upper test socket and the lower test socket are at the mold-closed state, the lower surface of the upper test socket is tightly attached to the upper surface of the lower test socket, and a gap is formed between the lower surface of the second protruding strip and the upper surface of the first protruding strip.

Another aspect of the present disclosure provides a formation method of an adaptive die test socket. The formation method includes providing an upper test socket and a lower test socket directly below the upper test socket, where the upper test socket and the lower test socket are capable of moving relative to each other along a vertical direction; and forming a groove at a lower surface of the upper test socket and/or at an upper surface of the lower test socket, such that an accommodating chamber for placing a die to-be-tested is formed between the upper test socket and the lower test socket at a mold-closed state. The upper test socket is connected to a support frame through an installation plate disposed above the upper test socket, where the support frame is capable of moving along a vertical direction; a strip-shaped through hole is formed on an upper surface of the support frame; a first protruding strip is at each of lower portions of two opposite inner walls of the strip-shaped through hole; a corresponding second protruding strip extending directly above the first protruding strip is at each of upper portions of two opposite side surfaces of the installation plate; a strip-shaped block is disposed above each second protruding strip; and a side of the strip-shaped block is fixedly connected to the upper surface of the support frame, and another side of the strip-shaped block extends to directly above the second protruding strip and is connected to the second protruding strip through at least two springs. When the upper test socket and the lower test socket are at a mold-opening state, a lower surface of the second protruding is adjoined to be in a contact with an upper surface of a corresponding first protruding strip; and when the upper test socket and the lower test socket are at the mold-closed state, the lower surface of the upper test socket is tightly attached to the upper surface of the lower test socket, and a gap is formed between the lower surface of the second protruding strip and the upper surface of the first protruding strip.

Other aspects of the present disclosure may be understood by those skilled in the art in light of the description, the claims, and the drawings of the present disclosure.

BRIEF DESCRIPTION OF THE DRAWINGS

Accompanying drawings, which are incorporated into a part of the present disclosure, illustrate embodiments of the present disclosure and together with the specification to explain the principle of the present disclosure. With reference to accompanying drawings, some specific embodiments of the present disclosure are described in detail below through a manner of illustration and not-limitation. Same reference numbers in accompanying drawings means same or similar parts or portions. Those skilled in the art should understand that accompanying drawings are not necessarily drawn according to scale.

FIG. 13 illustrates a structural schematic of a die testing region of an exemplary die testing apparatus.

FIG. 14 illustrates a flowchart of a formation method of an adaptive die test socket according to various embodiments of the present disclosure.

DETAILED DESCRIPTION

Figure 1:
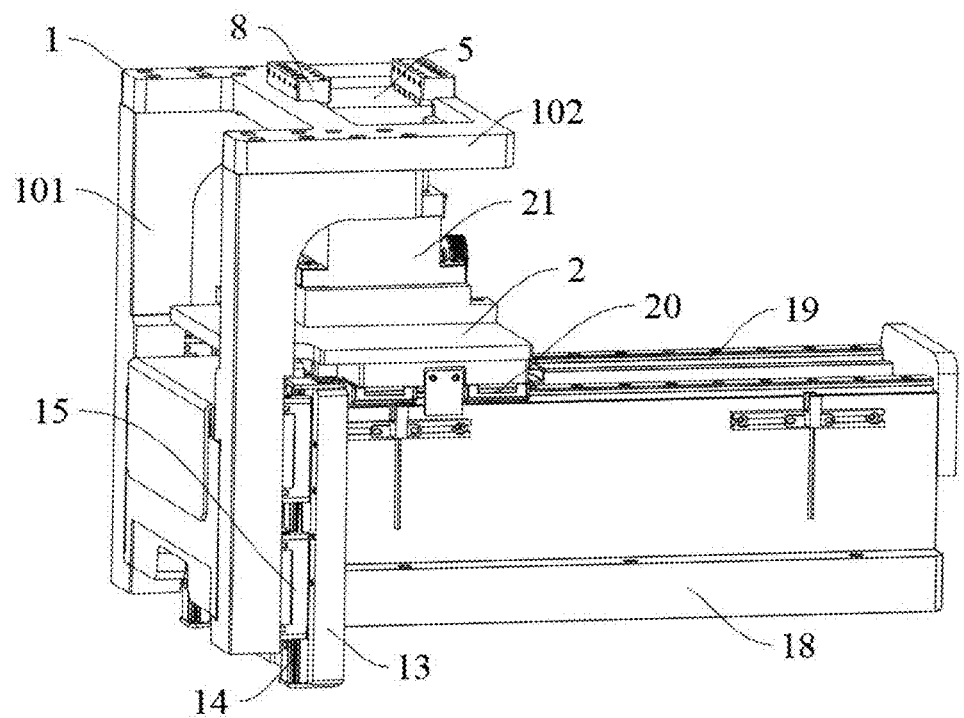
FIG. 1 illustrates an overall structural schematic of an adaptive die test socket according to various embodiments of the present disclosure.

Various exemplary embodiments of the present disclosure are described in detail with reference to accompanying drawings. It should be noted that unless stated otherwise, relative arrangement of assemblies and steps, numerical expressions and values described in those embodiments may not limit the scope of the present disclosure.

Following description of at least one exemplary embodiment may be merely illustrative and may not be configured to limit the present disclosure and its application or use.

The technologies, methods and apparatuses known to those skilled in the art may not be discussed in detail, but where appropriate, the technologies, methods and apparatuses should be considered as a part of the present disclosure.

In all examples shown and discussed herein, any specific value should be interpreted as merely exemplary, rather than as a limitation. Therefore, other examples in exemplary embodiment may have different values.

It is apparent to those skilled in the art that various modifications and variations may be made in the present disclosure without departing from the spirit or scope of the present disclosure. Therefore, the present disclosure is intended to cover modifications and variations of the present disclosure falling within the scope of corresponding claims (technical solutions to be protected) and their equivalents. It should be noted that, implementation manners provided in embodiment of the present disclosure may be combined with each other if there is no contradiction.

It should be noted that similar reference numerals and letters are configured to indicate similar items in following drawings. Therefore, once an item is defined in one drawing, it does not need to be further discussed in subsequent drawings.

The present disclosure can be further clearly understood through the specific examples given below, which may not limited the present disclosure.

A known good die (KGD) is defined as a package type fully supported by suppliers to meet or exceed quality, reliability, and functional data sheet specifications, with non-standardized (die specific) but completely and electronically transferable mechanical specifications. A KGD (known good die) testing apparatus (e.g., KGD testing machine, KGD tester, KGD testing equipment, or KGD test cell) is configured for the die testing before packaging and after splitting. The testing apparatus confirms that dies with desirable performance are used for packaging before high-density packaging, which improves the cumulative packaging yield. The testing apparatus may realize a fully automatic testing system and automatically realize picking, transporting, testing and unloading of dies. The testing apparatus may support multi-station parallel testing. Different stations may support different temperatures and test projects. Different stations may support static, dynamic, and avalanche function tests; and the test sequence may be adjustable. The testing apparatus may support high temperature testing with a temperature range from room temperature to 200° C. The power-on pin card may be a sealed design, support nitrogen filling protection against high-pressure sparking and nitrogen pressure monitoring and support high-temperature preheating and die surface anti-oxidation protection. It should be noted that "die" and "chip" may be interchangeable in the present disclosure.

Figure 2:
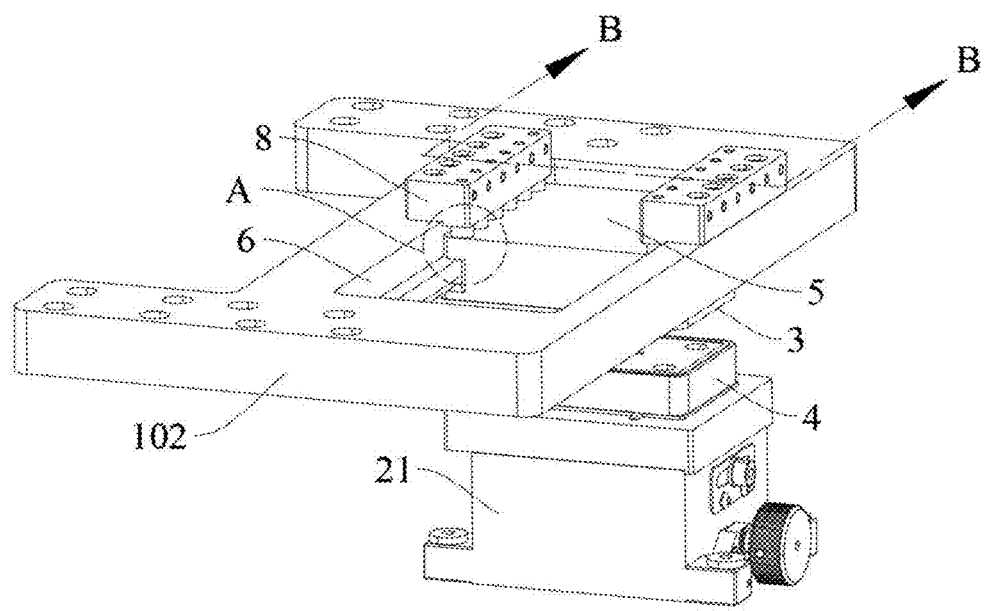
FIG. 2 illustrates a partial structural schematic of an adaptive die test socket according to various embodiments of the present disclosure.
Figure 3:
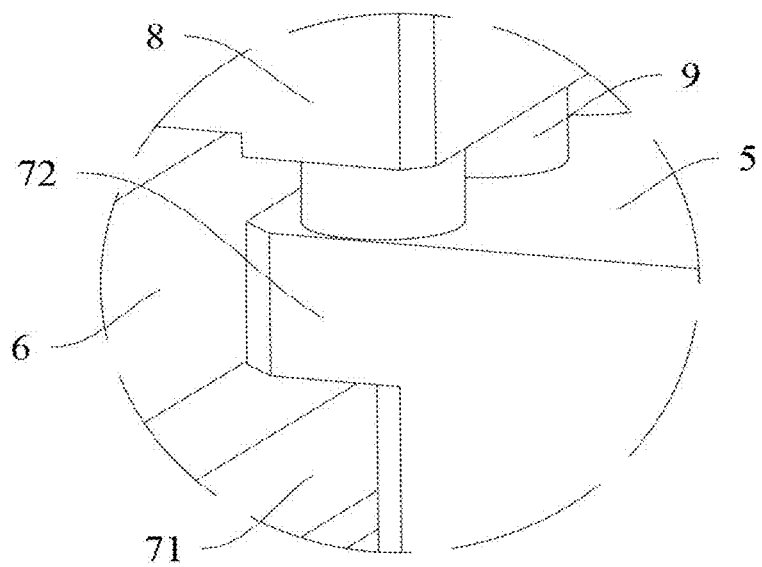
FIG. 3 illustrates an enlarged schematic of a location A in FIG. 2.
Figure 4:
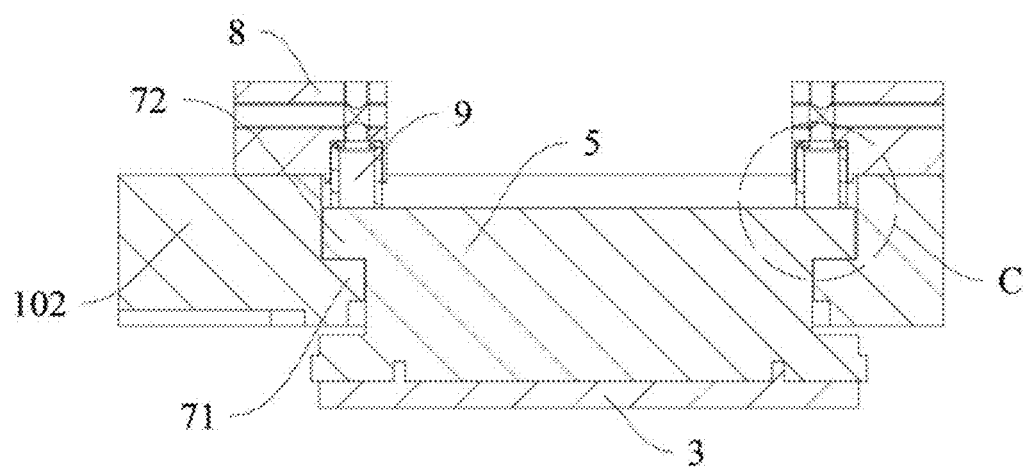
FIG. 4 illustrates a cross-sectional view along a B-B direction in FIG. 2.
Figure 5:
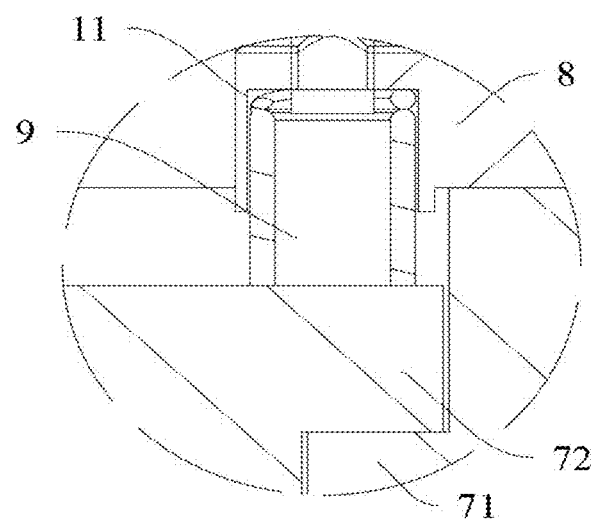
FIG. 5 illustrates an enlarged schematic of a location C in FIG. 4.
Figure 6:
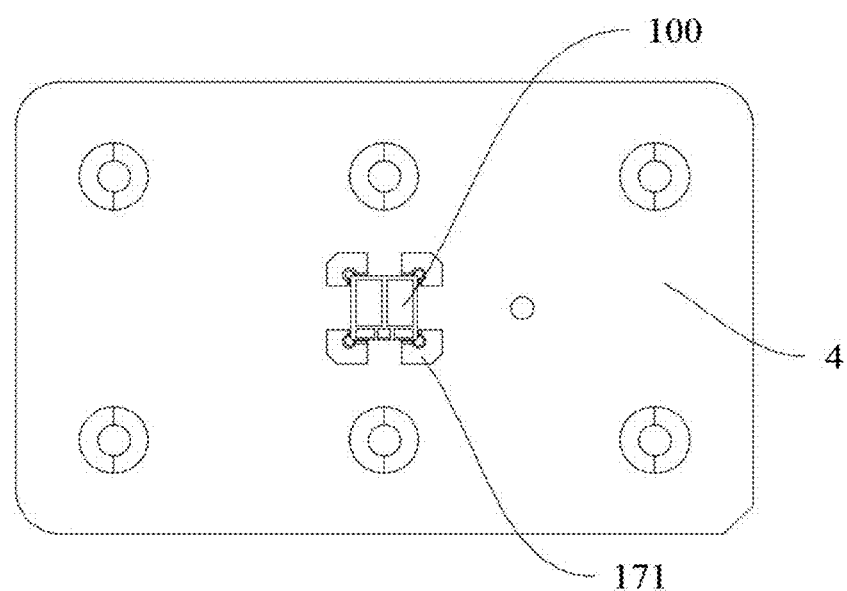
FIG. 6 illustrates a structural schematic of a lower test socket of an adaptive die test socket according to various embodiments of the present disclosure.
Figure 7:
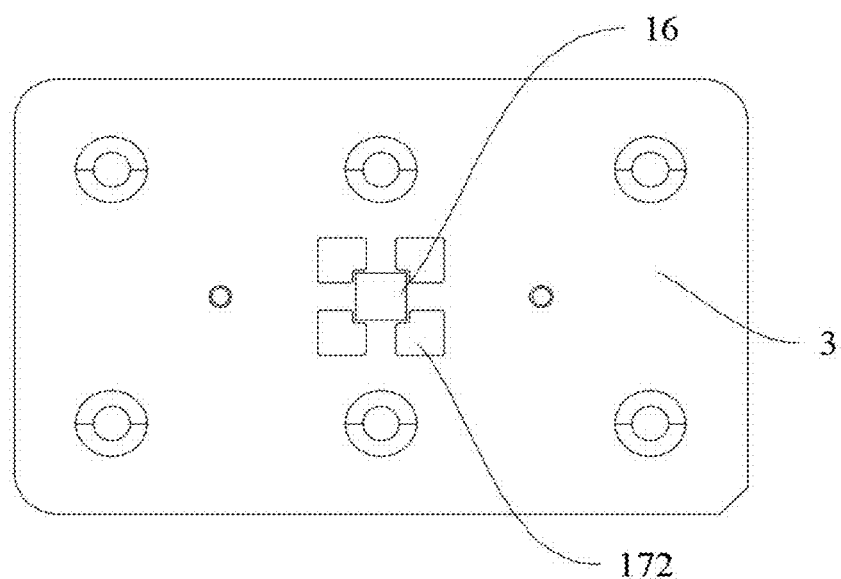
FIG. 7 illustrates a structural schematic of an upper test socket of an adaptive die test socket according to various embodiments of the present disclosure.
Figure 8:
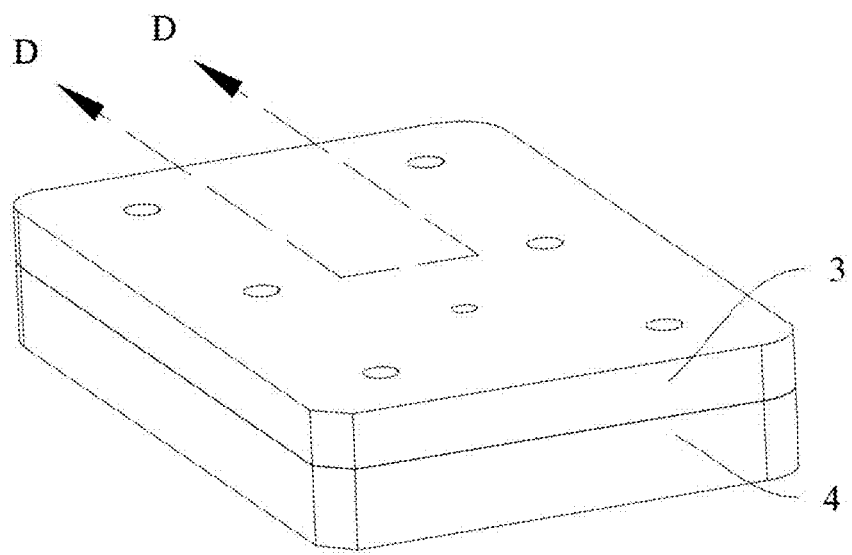
FIG. 8 illustrates another partial structural schematic of an adaptive die test socket according to various embodiments of the present disclosure.
Figure 9:
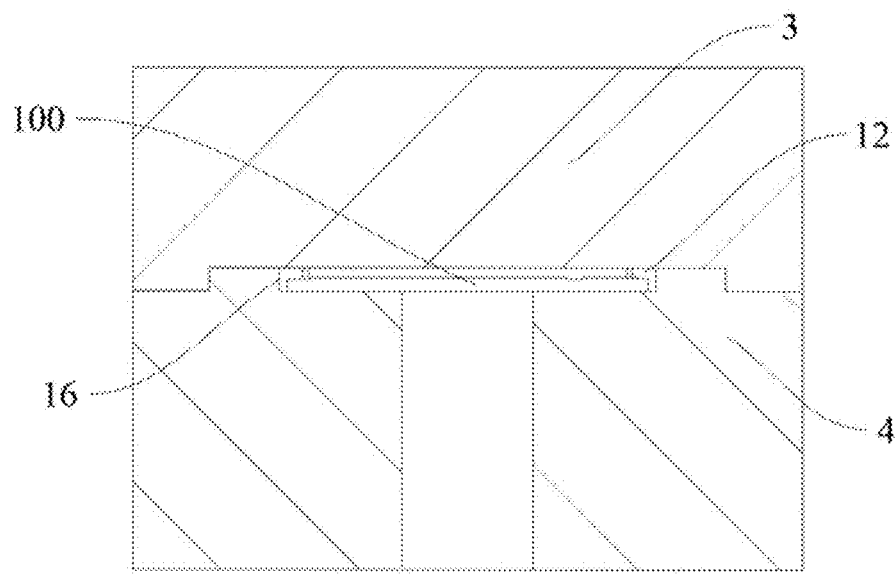
FIG. 9 illustrates a cross-sectional view along a D-D direction in FIG. 8.
Figure 10:
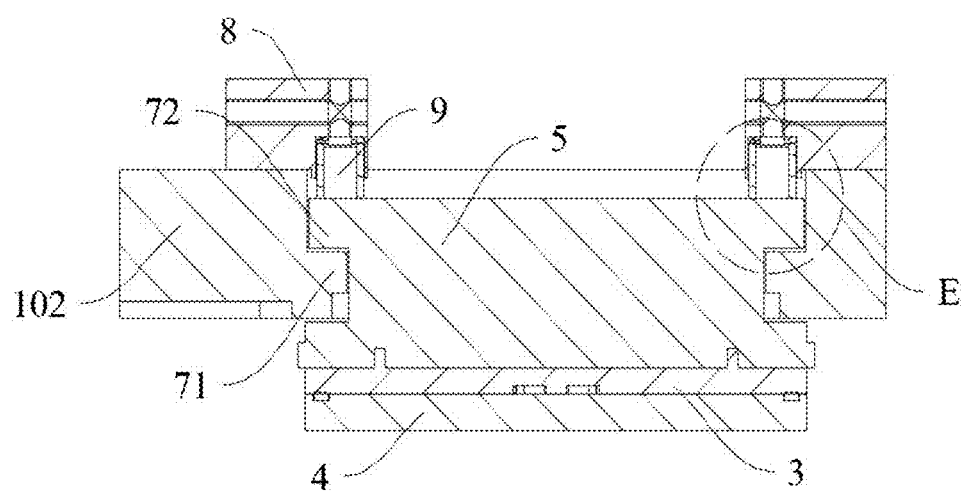
FIG. 10 illustrates a structural schematic of a mold-closed state of an adaptive die test socket according to various embodiments of the present disclosure.
Figure 11:
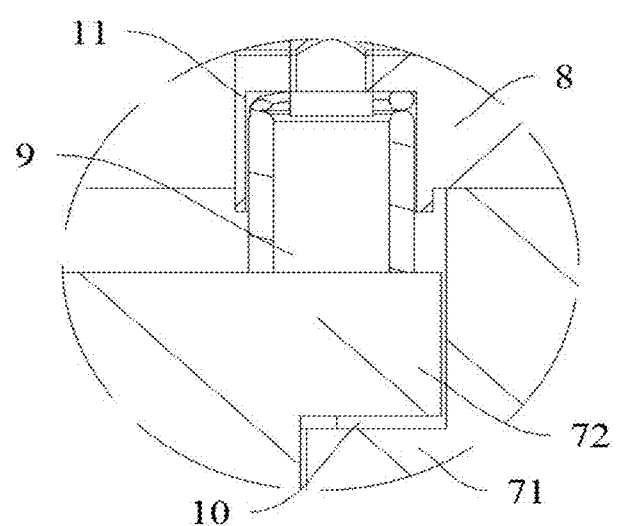
FIG. 11 illustrates an enlarged schematic of a location E in FIG. 10.

Exemplary embodiments are described in the present disclosure with reference to FIGS. 1-11, which are schematics used for describing various, different embodiments. Referring to FIGS. 1-11, FIG. 1 illustrates an overall structural schematic of an adaptive die test socket according to various embodiments of the present disclosure; FIG. 2 illustrates a partial structural schematic of an adaptive die test socket according to various embodiments of the present disclosure; FIG. 3 illustrates an enlarged schematic of a location A in FIG. 2; FIG. 4 illustrates a cross-sectional view along a B-B direction in FIG. 2; FIG. 5 illustrates an enlarged schematic of a location C in FIG. 4; FIG. 6 illustrates a structural schematic of a lower test socket of an adaptive die test socket according to various embodiments of the present disclosure; FIG. 7 illustrates a structural schematic of an upper test socket of an adaptive die test socket according to various embodiments of the present disclosure; FIG. 8 illustrates another partial structural schematic of an adaptive die test socket according to various embodiments of the present disclosure; FIG. 9 illustrates a cross-sectional view along a D-D direction in FIG. 8; FIG. 10 illustrates a structural schematic of a mold-closed state of an adaptive die test socket according to various embodiments of the present disclosure; and FIG. 11 illustrates an enlarged schematic of a location E in FIG. 10.

Exemplary Embodiment One

The present disclosure provides a die test socket. The die test socket may include an upper test socket 3 and a lower test socket 4 disposed directly below the upper test socket 3, where the upper test socket 3 and the lower test socket 4 may move relatively to each other along the vertical direction. The upper test socket and the lower test socket may form a mold. The mold may include two states, that is, a mold-closed state and a mold-opening state. The mold-closed state refers to that the die has been placed in the accommodating chamber, and the upper test socket and the lower test socket are pressed together. At this point, the accommodating chamber may be unsealed, and a protective atmosphere, such as nitrogen, may be filled into the accommodating chamber for subsequent testing. The mold-opening state refers to that the upper test socket and the lower test socket are open to be not pressed together. A groove 16 may be formed at the lower surface of the upper test socket 3 and the upper surface of the lower test socket 4, such that an accommodating chamber 12 for placing the die 100 to-be-tested may be formed between the upper test socket 3 and the lower test socket 4 at the mold-closed state.

The upper test socket 3 may be connected to a support frame 1 through an installation plate 5 disposed above the upper test socket 3, where the support frame 1 is capable of moving along a vertical direction. A strip-shaped through hole 6 may be formed on the upper surface of the support frame 1. A first protruding strip 71 may be at each of the lower portions of two opposite inner walls of the strip-shaped through hole 6. A corresponding second protruding strip 72 extending directly above the first protruding strip 71 may be at each of the upper portions of two opposite side surfaces of the installation plate 5. A strip-shaped block 8 may be disposed above each second protruding strip 72. A side of the strip-shaped block 8 may be fixedly connected to the upper surface of the support frame 1, and another side may extend to directly above the second protruding strip 72 and be connected to the second protruding strip 72 through at least two springs 9.

When the upper test socket 3 and the lower test socket 4 are at the mold-opening state, the lower surface of the second protruding strip 72 may be adjoined to be in a contact with the upper surface of a corresponding first protruding strip 71.

When the upper test socket 3 and the lower test socket 4 are at the mold-closed (test) state, the lower surface of the upper test socket 3 may be tightly attached to the upper surface of the lower test socket 4, and a gap 10 may be formed between the lower surface of the second protruding strip 72 and the upper surface of the first protruding strip 71.

The upper test socket installed on the installation plate may continue to move downward with the support frame and receive an upward reaction force from the lower test socket. Under the action of the reaction force, two second protruding strips on the installation plate may be upwardly separated from the first protruding strips on the support frame, such that a gap may be formed between the second protruding strips and the first protruding strips. Moreover, the springs may continuously exert a downward pressing force on two second protruding strips on the installation plate, and the downward pressing force is the mold closing force. At this point, the upper test socket installed on the installation plate may be at a floating state.

In one embodiment, each of above-mentioned second protruding strips 72 may be connected to the strip-shaped block 8 through a plurality of springs 9 (e.g., five springs) arranged at an equal interval along a length direction of the strip-shaped block 8.

In one embodiment, an installation groove 11 for the end portion of the spring 9 may be formed at both the upper surface of the second protruding strip 72 and the lower surface of the strip-shaped block 8.

In one embodiment, the strip-shaped through hole 6 may be formed at the horizontal portion 102 of the support frame 1. A vertical portion 101 of the support frame 1 may be installed on a surface of a side of an installation base plate 13, which is vertically configured, through at least two sets of vertical guiding rails 14 and vertical sliding blocks 15 matched with each other.

In one embodiment, a horizontal base 18 may be installed on a surface of another side of the installation base plate 13 and below the horizontal portion 102 of the support frame 1. Two horizontal guiding rails 35 disposed to be in parallel with and spaced apart from each other may be installed on the upper surface of the horizontal base 18. The lower surface of a movable plate 2 may be connected to each horizontal guiding rail 35 through at least two horizontal sliding blocks 36, and the lower test socket 4 may be installed on the movable plate 2.

The movable plate may be moved to a loading and unloading station at the end of the horizontal base away from the installation base plate to facilitate picking and placing of the dies.

Through a loading apparatus, a die to-be-tested (e.g., die before package) may be placed in a designated region on the lower test socket above the movable plate, that is, above multiple test pins; and multiple test pins and pad regions on the die to-be-tested may be in a one-to-one correspondence.

Subsequently, the movable plate may be pushed to move along the horizontal guiding rail toward the installation base plate through a horizontal drive component (such as a motor, a screw, or a cylinder) until the lower test socket is moved to a testing station directly below the upper test socket.

In one embodiment, a two-way sliding platform 21 may be installed on the upper surface of above-mentioned movable plate 2, and the lower test socket 4 may be installed on a movable portion of the two-way sliding platform 21 at a side opposite to the movable plate 2.

Exemplary Embodiment Two

The present disclosure provides an adaptive die test socket. The adaptive die test socket may include the upper test socket 3 and the lower test socket 4 disposed directly below the upper test socket 3, where the upper test socket 3 and the lower test socket 4 may move relatively to each other along the vertical direction. The groove 16 may be formed at the upper surface of the lower test socket 4, such that the accommodating chamber 12 for placing the die 100 to-be-tested may be formed between the upper test socket 3 and the lower test socket 4 at the mold-closed state. The upper test socket 3 may be connected to the support frame 1 through the installation plate 5 disposed above the upper test socket 3, where the support frame 1 is capable of moving along the vertical direction. The strip-shaped through hole 6 may be formed on the upper surface of the support frame 1. The first protruding strip 71 may be at each of the lower portions of two opposite inner walls of the strip-shaped through hole 6. A corresponding second protruding strip 72 extending directly above the first protruding strip 71 may be at each of the upper portions of two opposite side surfaces of the installation plate 5. The strip-shaped block 8 may be disposed above each second protruding strip 72. A side of the strip-shaped block 8 may be fixedly connected to the upper surface of the support frame 1, and another side may extend to directly above the second protruding strip 72 and be connected to the second protruding strip 72 through at least two springs 9.

As the support frame moves downward, the lower surface of the upper test socket may first be in a contact with the upper surface of the lower test socket, but there is still a slight deviation that prevents entire surfaces of the upper test socket and the lower test socket from being in a full contact with each other, which may realize the conversion of the plane reference of the upper test socket from the support frame to the lower test socket. Moreover, the spring may absorb and balance out small deviations along the horizontal plane, thereby achieving a tight and flat contact or attachment between the upper test socket and the lower test socket.

When the upper test socket 3 and the lower test socket 4 are at the mold-opening state, the lower surface of the second protruding strip 72 may be adjoined to be in a contact with the upper surface of a corresponding first protruding strip 71.

When the upper test socket 3 and the lower test socket 4 are at the mold-closed (test) state, the lower surface of the upper test socket 3 may be tightly attached to the upper surface of the lower test socket 4, and the gap 10 may be formed between the lower surface of the second protruding strip 72 and the upper surface of the first protruding strip 71.

In one embodiment, each of above-mentioned second protruding strips 72 may be connected to the strip-shaped block 8 through a plurality of springs 9 (e.g., six springs) arranged at an equal interval along a length direction of the strip-shaped block 8.

In one embodiment, the installation groove 11 for the end portion of the spring 9 may be formed at the upper surface of the second protruding strip 72.

In one embodiment, the strip-shaped through hole 6 may be formed at the horizontal portion 102 of the support frame 1. The vertical portion 101 of the support frame 1 may be installed on a surface of a side of the installation base plate 13, which is vertically configured, through at least two sets of vertical guiding rails 14 and vertical sliding blocks 15 matched with each other.

In one embodiment, the horizontal portion 102 of the support frame 1 may be at the upper end of the vertical portion 101 and extend to another side of the installation base plate 13.

In one embodiment, the groove 16 may be formed at the lower surface of above-mentioned upper test socket 3.

In one embodiment, a limiting protruding block 171 may be disposed at the upper surface of above-mentioned lower test socket 4 and directly below each of four corners of the groove 16. An avoiding groove 172 for the limiting protruding block 171 to be inserted may be formed at the lower surface of the upper test socket 3.

In one embodiment, the limiting protruding block 171 may be an L-shaped protruding block.

In one embodiment, each of four corners of the groove 16 may be connected to one avoiding groove 172.

The working principle of the present disclosure is described in detail hereinafter.

The movable plate may be moved to the loading and unloading station at the end of the horizontal base away from the installation base plate to facilitate picking and placing of the dies.

Through the loading apparatus, the die to-be-tested may be placed in a designated region on the lower test socket above the movable plate, that is, above multiple test pins; and multiple test pins and pad regions on the die to-be-tested may be in a one-to-one correspondence.

The movable plate may be pushed to move along the horizontal guiding rail toward the installation base plate through a horizontal drive component (such as a motor, a screw, or a cylinder) until the lower test socket is moved to a testing station directly below the upper test socket.

The support frame may be driven downward through a vertical drive component (such as a motor, a screw, or a cylinder).

In such process, as the support frame moves downward, firstly, the lower surface of the upper test socket may be in a contact with the upper surface of the lower test socket, but there is still a slight deviation that prevents entire surfaces of the upper test socket and the lower test socket from being in a full contact with each other.

Subsequently, the upper test socket installed on the installation plate may continue to move downward with the support frame and receive an upward reaction force from the lower test socket. Under the action of the reaction force, two second protruding strips on the installation plate may be upwardly separated from the first protruding strips on the support frame, thereby forming a gap between the second protruding strips and the first protruding strips. Moreover, the springs may continuously exert a downward pressing force on two second protruding strips on the installation plate; and the downward pressing force is the mold closing pressing force. At this point, the upper test socket installed on the installation plate may be in a floating state, and it realizes that the plane reference of the upper test socket may be converted from the support frame to the lower test socket; and the springs may absorb and balance out slight deviation on the horizontal plane, thereby achieving a tight and flat contact or attachment between the upper test socket and the lower test socket. In such way, it may ensure the consistency of the contact resistance between each test pin and corresponding pad region on the die, thereby improving test data consistency and avoiding sparking and pin ablation caused by poor contact in high-pressure environment.

After the test is completed, the mold may be opened, and the movable plate may drive the lower test socket to move back to the loading and unloading station; and then the unloading apparatus may pick the tested die, and the loading apparatus may re-insert a next die to-be-tested.

When using above-mentioned adaptive die test socket, after the upper test socket and the lower test socket are molded together, the plane reference of the upper test socket may be converted from the support frame to the lower test socket; and the springs may absorb and balance out slight deviation on the horizontal plane, thereby achieving a tight and flat contact or attachment between the upper test socket and the lower test socket. In such way, it may ensure the consistency of the contact resistance between each test pin and corresponding pad region on the die, thereby improving test data consistency.

Figure 12A:
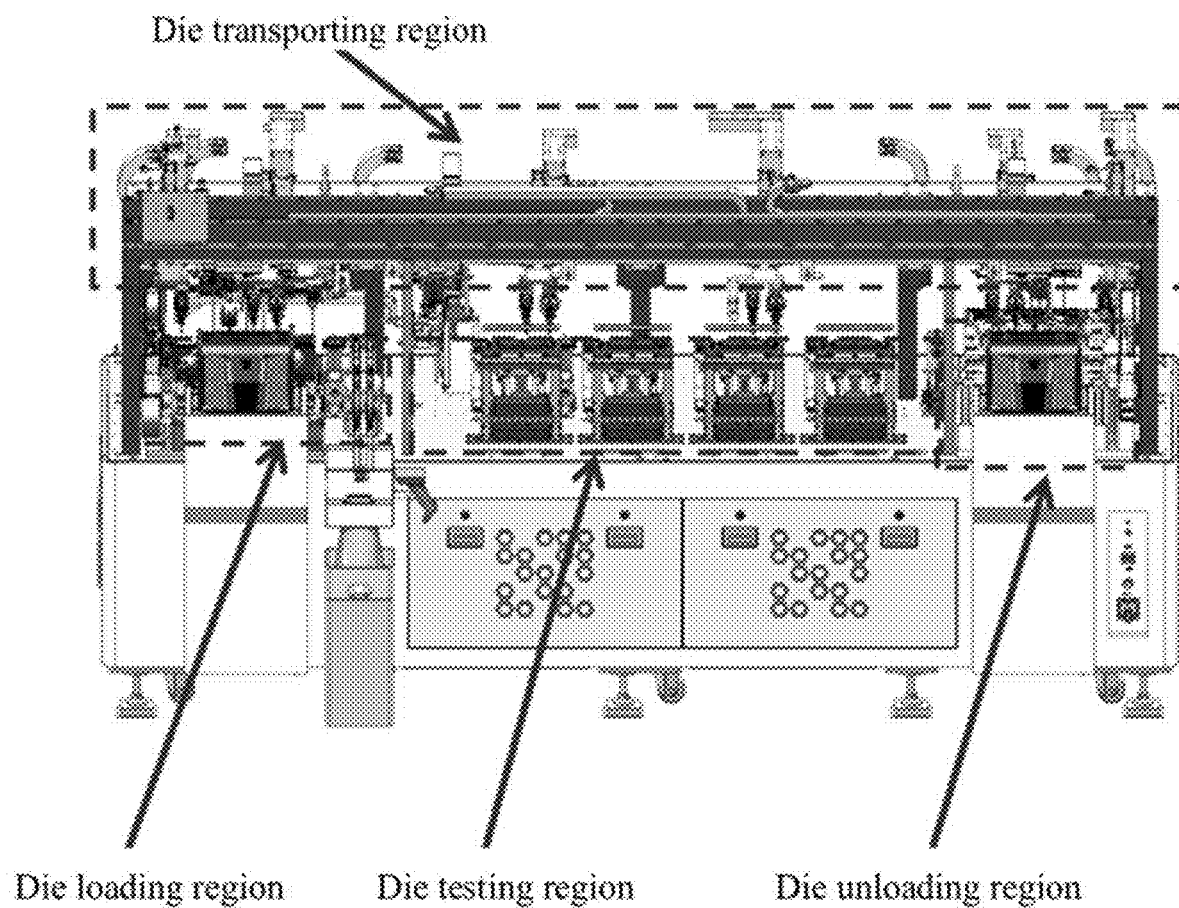
FIG. 12A illustrates a structural schematic of an exemplary die testing apparatus.
Figure 12B:
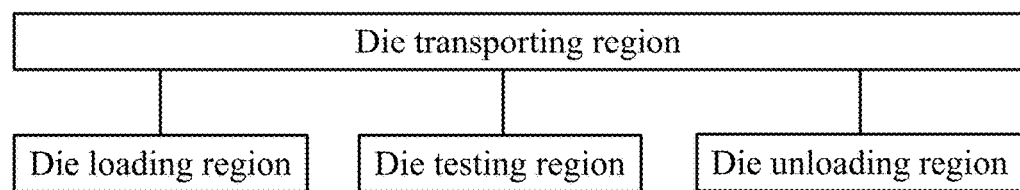
FIG. 12B illustrates a structural block diagram of the exemplary die testing apparatus in FIG. 12A.

The main structure of the die testing apparatus (e.g., machine) may include four regions, that is, a die automatic loading region, a die transporting region, a die testing region and a die unloading region, as shown in FIGS. 12A-12B. The adaptive die test socket may be configured in the die testing region of FIGS. 12A-12B and 13. Referring to FIGS. 12A-12B and 13, FIG. 12A illustrates a structural schematic of an exemplary die testing apparatus; FIG. 12B illustrates a structural block diagram of the exemplary die testing apparatus in FIG. 12A; and FIG. 13 illustrates a structural schematic of the die testing region of the exemplary die testing apparatus.

The automatic die loading region may be configured for wafer loading, die positioning, die stripping and die picking; or automatically pick up the dies from a tape reel, and adapt to wafers of different sizes. The die transporting region may be configured for picking up dies by suction and transporting dies between different test stations. The die testing region may be configured for die position correction, temperature control and testing of different projects. The die testing region may be set up with multiple stations to support multi-station parallel testing or serial testing, and different test projects. The die unloading region may be configured for appearance inspection and unloading to different bins after the die testing is completed, so that dies may be tested and classified into different die bins. In the die automatic loading region, a conventional die loading apparatus may be utilized.

In the die transporting region, an imported high-speed linear motor may be utilized to ensure die transporting speed and stability. The main improvement lies in the suction nozzle transporting apparatus of the die. The suction nozzle transporting apparatus may include six sets of sub-suction-nozzle transporting apparatuses, which may operate in parallel without interfering with each other. Each set of sub-suction-nozzle transporting apparatus may include two suction nozzles which may suck two dies simultaneously. Each set of suction nozzles may be positioned independently to facilitate quick switching between different products. The suction nozzle may support temperature control and be preheated at high temperatures. The specially designed nozzle may avoid contact with the critical regions of the dies and reduce the risk of crushing injuries. The pressure of the suction nozzle to suck the dies may be adjustable to avoid improper suction or crushing of die surfaces. The suction nozzle may be disposed with a vacuum pressure sensor. By adjusting a vacuum pressure value, the adsorption strength of the suction nozzle may be ensured to prevent dies from falling during suction and transporting processes.

Referring to FIG. 13, in the die testing region, two dies on the suction nozzle may place materials (dies) to the calibration platform simultaneously. Two dies may perform position calibration simultaneously to reduce calibration time. Two sets of upper test sockets may be installed on a connection board, and each set of sockets may be switched and powered through a signal switch. A high-temperature nitrogen interface may be reserved on the socket of each set. Two sets of lower test sockets may be installed on a test carrier, each reserving two sets of temperature control interfaces. The upper and lower test sockets may be independent of each other, making position correction and maintenance more convenient. The lower test socket may be mounted on a high-speed linear motor and may quickly switch between a loading position and a testing position. A CCD (charge coupled device) may be disposed above a testing site to visually identify whether the die is correctly placed on the testing site. The testing site may be equipped with a vacuum pressure detection system. By determining a pressure value of a sucked die, whether the die is correctly placed on the site and whether there are any abnormalities such as warping may be determined, thereby ensuring that the die is correctly placed on the testing site and preventing warping or flipping.

In the die unloading region, a conventional material (die and/or wafer) unloading apparatus may be applied. An unloading station may be equipped with material (wafer/die) box in-situ detection to prevent unloading failure or abnormality due to that the material box is not empty in the unloading station or the material box is not in a safe position. A large-view CCD may be installed at the unloading station, which may monitor in real time whether an angle and a spacing of the die after being placed in the blue film are abnormal.

Exemplary Embodiment Three

The present disclosure provides a formation method of the adaptive die test socket. FIG. 14 illustrates a flowchart of the formation method of the adaptive die test socket according to various embodiments of the present disclosure. Referring to FIG. 14, the formation method may include following exemplary steps.

At S100, the upper test socket 3 and the lower test socket 4 directly below the upper test socket 3 are provided, where the upper test socket 3 and the lower test socket 4 are capable of moving relative to each other along the vertical direction.

At S102, the groove 16 is formed at a lower surface of the upper test socket 3 and/or at an upper surface of the lower test socket 4, such that the accommodating chamber 12 for placing the die to-be-tested 100 is formed between the upper test socket 3 and the lower test socket 4 at the mold-closed state.

It should be noted that other descriptions of similar or same parts and/portions related to the die test sockets may refer to above-mentioned exemplary embodiment one and two, which may not be described in detail herein.

It may be seen from above-mentioned embodiments that the following beneficial effects may be at least achieved.

For the adaptive die test socket, the upper test socket is connected to the support frame through the installation plate disposed above the upper test socket, where the support frame is capable of moving along the vertical direction; the strip-shaped through hole is formed on the upper surface of the support frame; the first protruding strip is at each of lower portions of two opposite inner walls of the strip-shaped through hole; a corresponding second protruding strip extending directly above the first protruding strip is at each of upper portions of two opposite side surfaces of the installation plate; the strip-shaped block is disposed above each second protruding strip; and a side of the strip-shaped block is fixedly connected to the upper surface of the support frame, and another side of the strip-shaped block extends to directly above the second protruding strip and is connected to the second protruding strip through at least two springs. When the upper test socket and the lower test socket are at the mold-opening state, the lower surface of the second protruding is adjoined to be in a contact with the upper surface of a corresponding first protruding strip. When the upper test socket and the lower test socket are at the mold-closed state, the lower surface of the upper test socket is tightly attached to the upper surface of the lower test socket, and the gap is formed between the lower surface of the second protruding strip and the upper surface of the first protruding strip. After the upper test socket and the lower test socket are molded together, the plane reference of the upper test socket may be converted from the support frame to the lower test socket; and the springs may absorb and balance out slight deviation on the horizontal plane, thereby achieving a tight and flat contact or attachment between the upper test socket and the lower test socket. In such way, it may ensure the consistency of the contact resistance between each test pin and corresponding pad region on the die, thereby improving test data consistency.

Above-mentioned embodiments may be only for illustrating technical concepts and features of the present disclosure. The purpose may be to make those skilled in the art understand the content of the present disclosure and implement the present disclosure accordingly and may not limit the protection scope of the present disclosure. All equivalent changes or modifications made based on the spirit and essence of the present disclosure shall be included in the protection scope of the present disclosure.

What is claimed is:

1. An adaptive die test socket, comprising:
    an upper test socket and a lower test socket disposed directly below the upper test socket, wherein the upper test socket and the lower test socket are capable of moving relative to each other along a vertical direction; and a groove is formed at a lower surface of the upper test socket and/or at an upper surface of the lower test socket, such that an accommodating chamber for placing a die to-be-tested is formed between the upper test socket and the lower test socket at a mold-closed state, wherein:

the upper test socket is connected to a support frame through an installation plate disposed above the upper test socket, wherein the support frame is capable of moving along a vertical direction; a strip-shaped through hole is formed on an upper surface of the support frame; a first protruding strip is at each of lower portions of two opposite inner walls of the strip-shaped through hole; a corresponding second protruding strip extending directly above the first protruding strip is at each of upper portions of two opposite side surfaces of the installation plate; a strip-shaped block is disposed above each second protruding strip; and a side of the strip-shaped block is fixedly connected to the upper surface of the support frame, and another side of the strip-shaped block extends to directly above the second protruding strip and is connected to the second protruding strip through at least two springs;

when the upper test socket and the lower test socket are at a mold-opening state, a lower surface of the second protruding is adjoined to be in a contact with an upper surface of a corresponding first protruding strip; and when the upper test socket and the lower test socket are at the mold-closed state, the lower surface of the upper test socket is tightly attached to the upper surface of the lower test socket, and a gap is formed between the lower surface of the second protruding strip and the upper surface of the first protruding strip.

2. The adaptive die test socket according to claim 1, wherein:

each second protruding strip is connected to the strip-shaped block by a plurality of springs arranged at an equal interval along a length direction of the strip-shaped block.

3. The adaptive die test socket according to claim 1, wherein:

an installation groove for an end portion of a spring to be inserted is formed at an upper surface of the second protruding strip and/or at a lower surface of the strip-shaped block.

4. The adaptive die test socket according to claim 1, wherein:

the strip-shaped through hole is formed at a horizontal portion of the support frame; and a vertical portion of the support frame is installed on a surface of a side of an installation base plate, which is vertically configured, through at least two sets of vertical guiding rails and vertical sliding blocks matched with each other.

5. The adaptive die test socket according to claim 4, wherein:

the horizontal portion of the support frame is at an upper end of the vertical portion and extends to another side of the installation base plate.

6. The adaptive die test socket according to claim 4, wherein:

a horizontal base is installed on a surface of another side of the installation base plate and below the horizontal portion of the support frame; two horizontal guiding rails in parallel with and spaced apart with each other are installed on an upper surface of the horizontal base; a lower surface of a movable plate is connected to each horizontal guiding rail through at least two horizontal sliding blocks; and the lower test socket is installed on the movable plate.

7. The adaptive die test socket according to claim 6, wherein:

a two-way sliding platform is installed on an upper surface of the movable plate; and the lower test socket is installed on a movable portion of the two-way sliding platform at a side opposite to the movable plate.

8. The adaptive die test socket according to claim 1, wherein:

a limiting protruding block is disposed at the upper surface of the lower test socket and directly below each of four corners of the groove.

9. The adaptive die test socket according to claim 8, wherein:

an avoiding groove for the limiting protruding block to be inserted is formed at the lower surface of the upper test socket.

10. The adaptive die test socket according to claim 8, wherein:

the limiting protruding block is an L-shaped protruding block.

* * * * *